(12) United States Patent
Moriyama

(10) Patent No.: US 8,296,111 B2
(45) Date of Patent: Oct. 23, 2012

(54) SIMULATION SYSTEM AND SIMULATION METHOD

(75) Inventor: Yuu Moriyama, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 499 days.

(21) Appl. No.: 12/579,011

(22) Filed: Oct. 14, 2009

(65) Prior Publication Data
US 2010/0100365 A1 Apr. 22, 2010

(30) Foreign Application Priority Data

Oct. 16, 2008 (JP) ................................. 2008-267574

(51) Int. Cl.
G06G 7/48 (2006.01)
(52) U.S. Cl. .................. 703/8; 703/17; 703/19; 701/533
(58) Field of Classification Search .................. 703/6, 8,
703/17, 19; 700/1; 370/235, 282; 701/455,
701/533; 340/990, 995.19
See application file for complete search history.

(56) References Cited

U.S. PATENT DOCUMENTS

| 3,992,707 | A | * | 11/1976 | Schmidtlein et al. | ............ | 342/58 |
| 5,777,875 | A | * | 7/1998 | Miyano | ............................ | 700/83 |
| 6,038,507 | A | * | 3/2000 | Miyano | ......................... | 701/533 |
| 6,678,886 | B2 | * | 1/2004 | Kumon | ......................... | 717/151 |
| 7,397,971 | B2 | * | 7/2008 | Oka | ............................... | 382/298 |
| 7,404,149 | B2 | | 7/2008 | Fox et al. | | |
| 7,747,984 | B2 | * | 6/2010 | Hsu | ............................... | 717/124 |
| 7,930,635 | B2 | * | 4/2011 | Mann et al. | .................. | 715/700 |
| 2005/0207344 | A1 | * | 9/2005 | Yamashiro | .................... | 370/235 |
| 2006/0005640 | A1 | * | 1/2006 | Osaka | ........................ | 73/863.83 |
| 2007/0285388 | A1 | * | 12/2007 | Ogasawara | ................... | 345/157 |
| 2010/0004916 | A1 | * | 1/2010 | Stauder et al. | .................. | 703/17 |

FOREIGN PATENT DOCUMENTS

| JP | A-5-290119 | 11/1993 |
| JP | U-7-36243 | 7/1995 |
| JP | A-9-222980 | 8/1997 |
| JP | A-2006-521611 | 9/2006 |
| JP | A-2007-52580 | 3/2007 |

OTHER PUBLICATIONS

"Diversifying Hils;" *All About Car Electronics*, May 21, 2008; pp. 244-249; Nikkei BP Inc.

* cited by examiner

*Primary Examiner* — Russell Frejd
(74) *Attorney, Agent, or Firm* — Oliff & Berridge, PLC

(57) ABSTRACT

A simulation system is provided. A simulator is configured to execute simulation of a simulation object at a processing speed. A user interface module is configured to generate at least one of a first operation screen for inputting simulation conditions on the simulation executed by the simulator and an output screen for representing a result of the simulation executed by the simulator, and to display the at least one of the first operation screen and the output screen on a display unit. An adjustor is configured to adjust an updating speed of the at least one of the first operation screen and the output screen which are displayed on the display unit by the user interface module to be different from the processing speed.

9 Claims, 12 Drawing Sheets

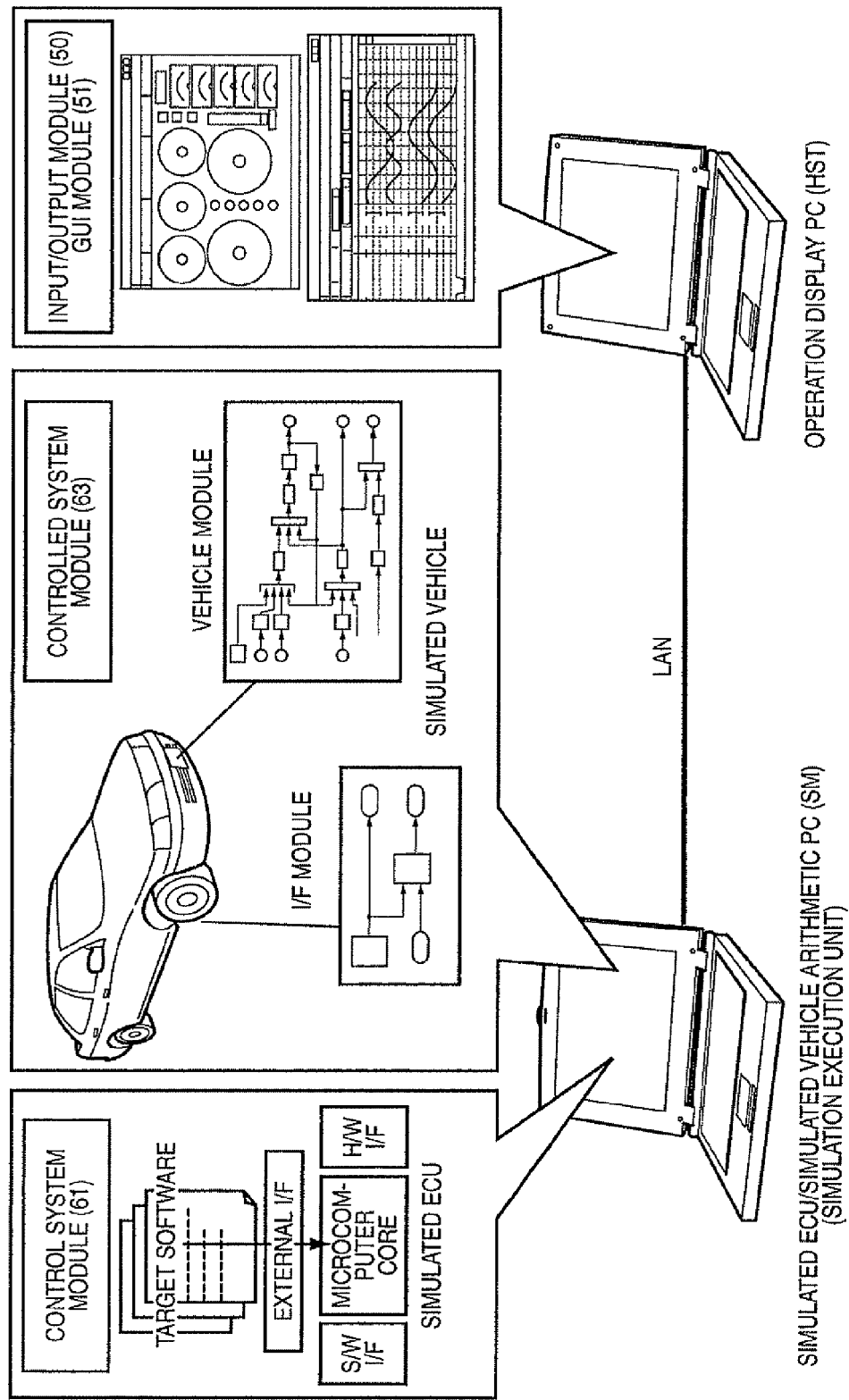

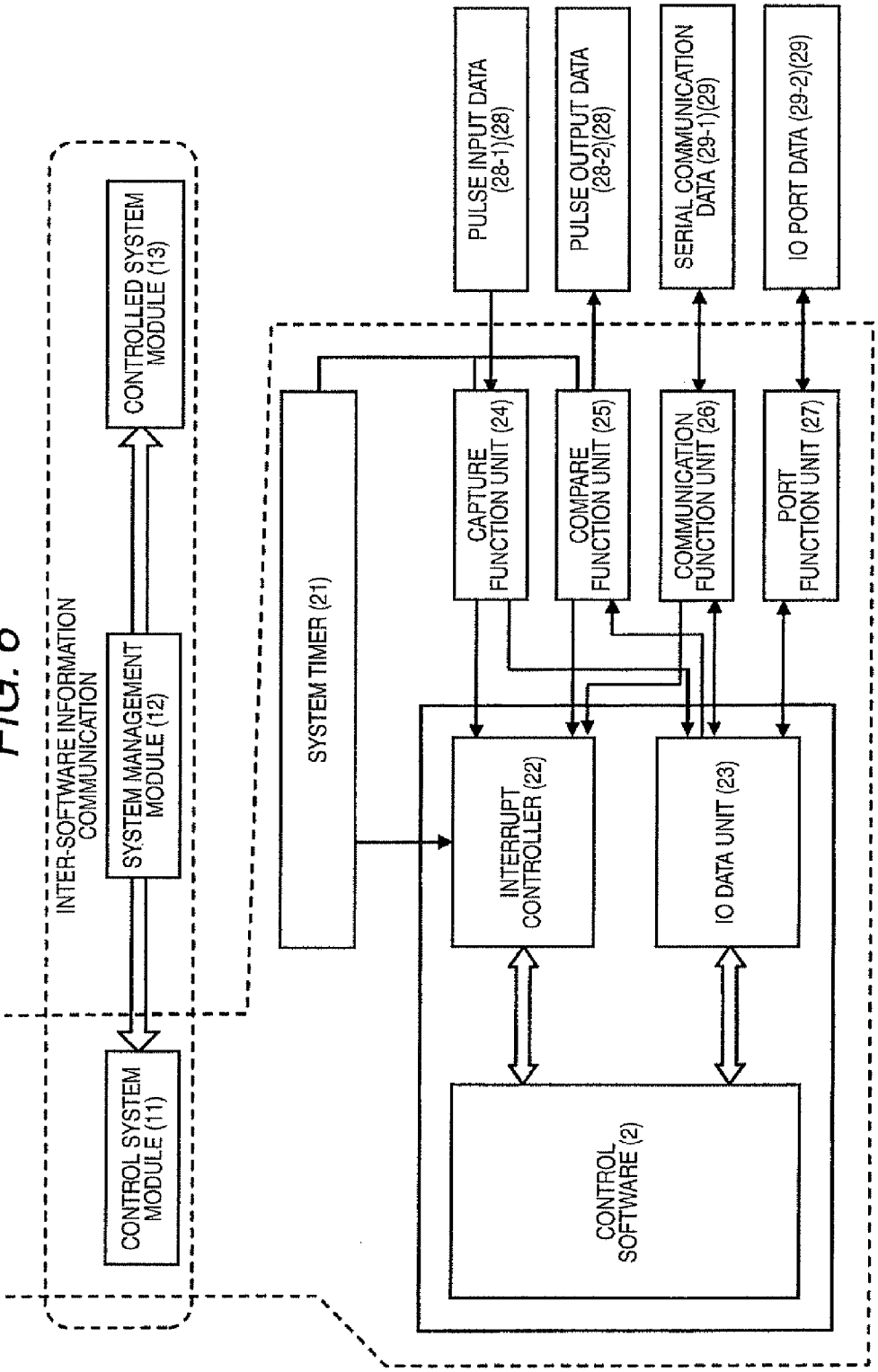

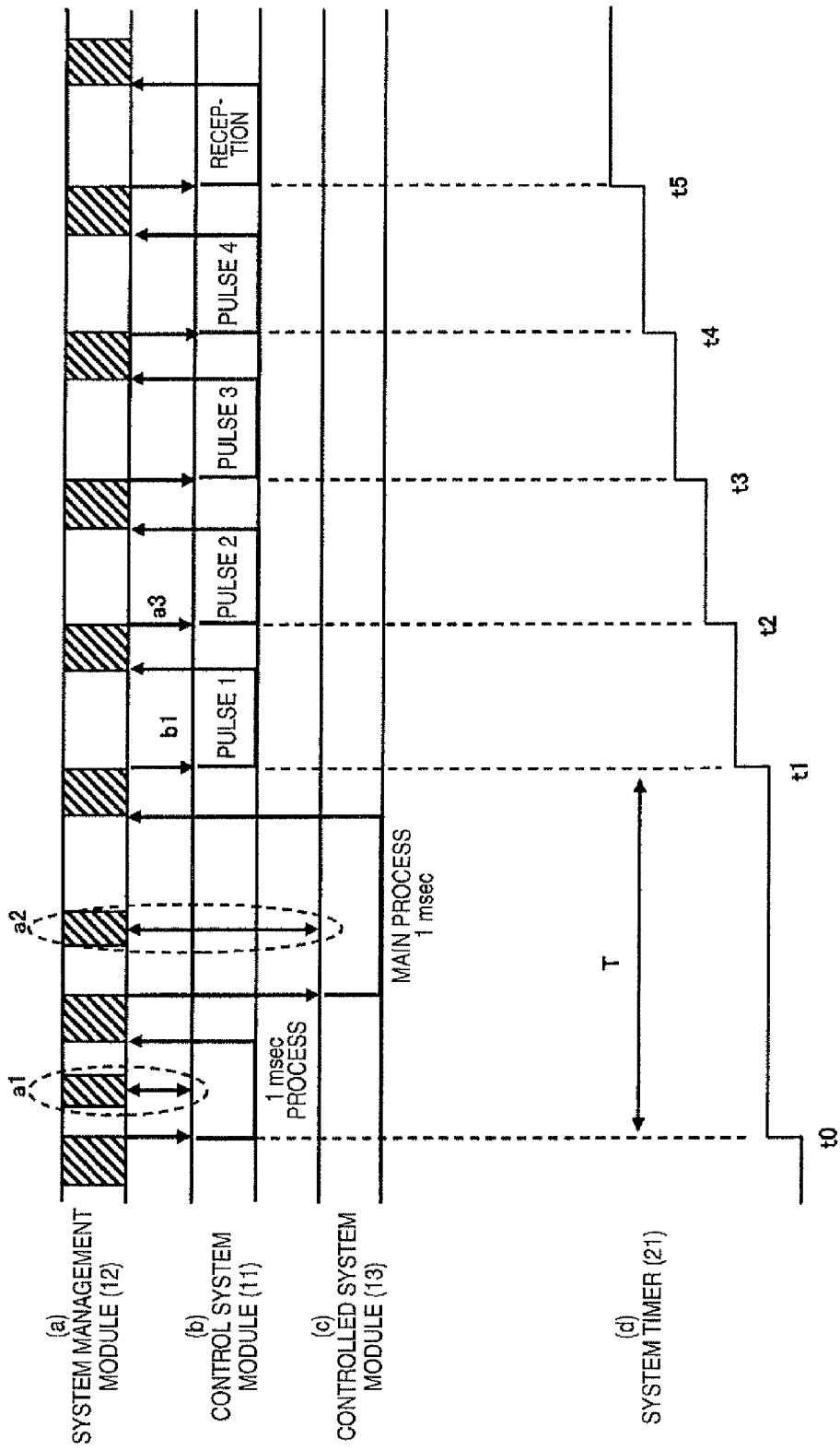

FIG. 8

| TIME | EVENT CONTENT | ACQUISITION SOURCE | ACTION |
|---|---|---|---|
| t0 | 1 msec INTERRUPT IS GENERATED (PUNCTUAL PROCESS OF CONTROL SYSTEM MODULE AND CONTROLLED SYSTEM MODULE) | GENERATED IN SYSTEM MANAGEMENT MODULE | CONTROL SYSTEM MODULE/1 msec PROCESS ACTIVATED CONTROLLED SYSTEM MODULE/MAIN PROCESS ACTIVATED |
| t1 | PULSE 1 INPUT IS GENERATED | PULSE 1 OUTPUT REQUEST IS RECEIVED FROM CONTROLLED SYSTEM MODULE, AND PULSE GENERATION TIME IS SET | CONTROL SYSTEM MODULE/PULSE 1 PROCESS ACTIVATED |
| t2 | PULSE 2 OUTPUT IS GENERATED | PULSE 2 OUTPUT REQUEST IS RECEIVED FROM CONTROL SYSTEM MODULE, AND PULSE GENERATION TIME IS SET | CONTROL SYSTEM MODULE /PROCESS ACTIVATED AT THE TIME OF PULSE 2 OUTPUT ACTIVATED |
| t3 | PULSE 3 INPUT IS GENERATED | PULSE 3 OUTPUT REQUEST IS RECEIVED FROM CONTROLLED SYSTEM MODULE, AND PULSE GENERATION TIME IS SET | CONTROL SYSTEM MODULE/PULSE 3 PROCESS ACTIVATED |
| t4 | PULSE 4 OUTPUT IS GENERATED | PULSE 4 OUTPUT REQUEST IS RECEIVED FROM CONTROL SYSTEM MODULE, AND PULSE GENERATION TIME IS SET | CONTROL SYSTEM MODULE /PROCESS ACTIVATED AT THE TIME OF PULSE 4 OUTPUT ACTIVATED |
| t5 | RECEPTION EVENT IS GENERATED | GENERATED IN SYSTEM MANAGEMENT MODULE IN ACCORDANCE WITH COMMUNICATION SPECIFICATION | CONTROL SYSTEM MODULE/RECEPTION PROCESS ACTIVATED |

SIMULATION SYSTEM AND SIMULATION METHOD

The disclosure of Japanese Patent Application No. 2008-267574 filed on Oct. 16, 2008 including specification, drawings and claims is incorporated herein by reference in its entirety.

BACKGROUND

The present invention relates to a simulation system and a simulation method for development of control software.

When control software which is to be incorporated into a microcomputer for controlling an apparatus is developed in advance of development of the apparatus, a logic evaluation of the control software under development is carried out by using a simulator which simulates the nonexistent apparatus on a computer.

For example, in order to develop control software of an ECU (Electronic Control Unit) in which a microcomputer for controlling an engine, a brake, or the like of a vehicle is incorporated, in advance of development of an actual vehicle, a simulation system is constructed. This simulation system includes a vehicle simulator which simulates the motion of the vehicle on the computer and the ECU which are connected to each other and carries out the logic evaluation of the control software under development.

Patent Document 1 describes this type of simulation system such as a HILS (Hardware In the Loop Simulation) system or a SILS (Software In the Loop Simulation) system.

The HILS system is a system which connects a real ECU to a vehicle simulator so as to verify control software under development. The SILS system is a system which constructs an ECU simulator which simulates the ECU on the computer, instead of the real ECU, and a vehicle simulator on a general-use computer, such as a personal computer or the like, so as to verify control software under development.

As shown in FIG. 1, the HILS system is a cyclic driven system which executes a series of operations described below in a predetermined cycle. That is, an electrical signal output from the real ECU in which the control software (target software) under development is installed is converted into a logical signal through an I/F board. The logical signal is input to a high-performance CPU which runs software for simulating the vehicle motion, and is subjected to an arithmetic process. A logical signal obtained as a result of the arithmetic process is again converted into an electrical signal through the I/F board, and the electrical signal is fed back to the ECU. In this system, a feedback loop is constructed by hardware, such as the ECU, the I/F board, the high-performance CPU, and the like.

As shown in FIG. 2, a simulated ECU which runs software for simulating the motion of the microcomputer constituting the ECU and the motion of a peripheral circuit on the high-performance CPU is constructed in the SILS system. The SILS system is a cyclic driven system which executes a series of operations described below in a predetermined cycle. That is, a logical signal output from the simulated ECU is input to the high-performance CPU which runs the software for simulating the vehicle motion through an I/F model which simulates the I/F board and is subjected to an arithmetic process. A logical signal obtained as a result of the arithmetic process is fed back to the simulated ECU through the IN model. In this system, the ECU, the I/F board, and the vehicle are all implemented by software, and a feedback is constructed by software.

In the SILS system, instead of hardware of the ECU and software for simulating the I/F board of the vehicle model, a control system module and a controlled system module are constructed. The control system module simulates a logical arithmetic unit of the microcomputer incorporated into the ECU which runs a control program. The controlled system module is the vehicle model which simulates the motion of the vehicle. Further, a system management module for managing predetermined events generated in the control system and the controlled system in time series and controls the simulated ECU and the vehicle model in a stepwise manner for each event. This type of SILS system is referred to as an event driven type system in which a calculation cycle varies.

A simulation system is configured to include a simulation execution unit using such a HILS system or a SILS system, an input/output module which operates in synchronization with the simulation execution unit, delivers simulation conditions to the simulation execution unit, and receives a simulation result from the simulation execution unit, and a user interface module which generates an operation screen for inputting the simulation conditions, or an output screen for representing the simulation result, and displays the generated screen on a display unit.

The HILS system is useful when developing the control software by using the existing ECU, and the SILS system is useful in that the control software can be developed even though no ECU serving as a target is provided.

Patent Document 1: JP-A-2007-52580

Non-Patent Document 1: "All about Car Electronics 2008, Diversifying HILS", Nikkei BP Inc., May 21, 2008, (pp. 244 to 249)

As shown in FIG. 3A, if the cyclic driven HILS system is used, the simulation progress time and the actual time are substantially identical, and simulation can be executed in real time. Meanwhile, as shown in FIG. 3B, when the cyclic driven SILS system is used, an overhead for executing detailed simulation of the ECU becomes large, and the execution cycle of control software would increase even though a high-performance CPU is provided. For these reasons, there are many cases where the simulation progress time becomes longer than the actual time.

As shown in FIG. 3C, if the event driven SILS system is used, the control software is run in a stepwise manner in response to a predetermined event. Accordingly, without performing a special process for synchronizing the simulation progress time with the actual time, simulation is executed regardless of the actual time. As a result, there are many cases where the simulation progress time becomes quicker than the actual time.

In the related art, however, the updating speed of the operation screen or the output screen displayed on the display unit by the user interface module is synchronized with the processing speed of the simulation execution unit. Accordingly, if a SILS system is used as the simulation execution unit, an operator who views the status of the executed simulation through the user interface module or operates the user interface module may be suffered inconveniences.

For example, when a cyclic driven SILS system is used as the simulation execution unit, even though the operator operates the operation screen, it may be impossible to determine whether the operation is properly received or not since the display response is delayed, and the operator may erroneously operate the operation screen again. For this reason, desired simulation may not be executed.

Even though the operator operates to turn on an ignition switch displayed on the operation screen, there may be no response and thus the operator again operates to turn on the ignition switch. Accordingly, the user interface module may recognize that the operator operates to turn off the ignition switch.

Even though an accelerator operating switch displayed on the operation screen is operated so as to increase the degree of opening of the accelerator, it takes considerable time until the engine revolution displayed on the output screen increases. For this reason, it may be difficult to determine whether or not simulation is normally executed.

Meanwhile, if an event driven SILS system is used, the operation screen to be operated by the operator is updated instantaneously. Accordingly, sufficient operation timing for the operator may not be ensured. Further, the output screen that the operator will confirm is updated instantaneously. Accordingly, sufficient confirmation timing for the operator may not be ensured.

SUMMARY

It is therefore an object of at least one embodiment of the present invention to provide a simulation system including a user interface module capable of ensuring operation timing or confirmation timing for an operator, without causing degradation in performance of the entire simulation environment.

In order to achieve the above described object, according to a first aspect of at least one embodiment of the present invention, there is provided a simulation system comprising: a simulator configured to execute simulation of a simulation object at a processing speed; a user interface module configured to generate at least one of a first operation screen for inputting simulation conditions on the simulation executed by the simulator and an output screen for representing a result of the simulation executed by the simulator, and to display the at least one of the first operation screen and the output screen on a display unit; and an adjustor configured to adjust an updating speed of the at least one of the first operation screen and the output screen which are displayed on the display unit by the user interface module to be different from the processing speed.

According to the above-described configuration, the adjustor adjusts the updating speed of at least one of the operation screen and the output screen which are displayed on the display unit by the user interface module to be different from the processing speed of the simulator. Therefore, when the processing speed of the simulator is slow, the screen updating speed is adjusted to be faster, and when the processing speed of the simulator is fast, the screen updating speed is adjusted to be slower.

According to a second aspect of at least one embodiment of the present invention, there is provided a simulation method executed in a simulation system including at least a simulator and a user interface module with a display unit, comprising: displaying a first operation screen on the display; inputting simulation conditions through the first operation screen; executing simulation by the simulator at a processing speed, based on the simulation conditions; displaying an output screen which represents a result of the simulation on the display; and adjusting an updating speed of the at least one of the first operation screen and the output screen to be different from the processing speed.

BRIEF DESCRIPTION OF THE DRAWINGS

The above objects and advantages of the present invention will become more apparent by describing in detail preferred exemplary embodiments thereof with reference to the accompanying drawings, wherein:

FIG. 2 is a schematic view illustrating a simulation system using a cyclic driven SILS system;

FIG. 6 is a block diagram illustrating a control system module of the event driven SILS system;

FIG. 7 is a timing chart illustrating the operation of the event driven SILS system;

FIG. 8 is an explanatory table illustrating event management;

DETAILED DESCRIPTION OF THE EMBODIMENTS

Hereinafter, a simulation system and a simulation method according to an embodiment of the invention will be described.

Figure 4:
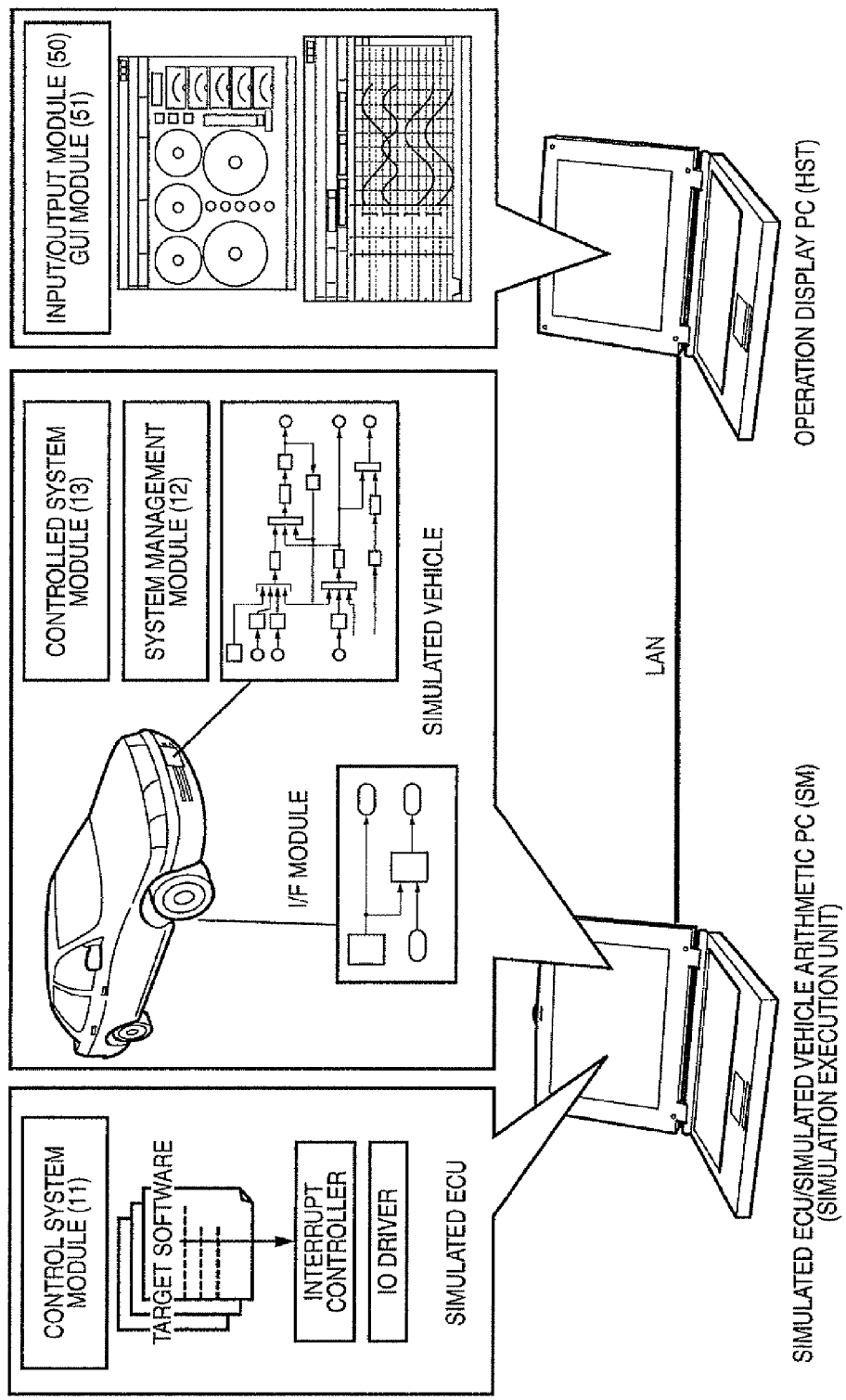
FIG. 4 is a schematic view illustrating a simulation system using an event driven SILS system.

As shown in FIG. 4, a simulation system 1 includes a simulation execution unit SM which simulates a control system serving as a simulation object at a predetermined processing speed, and an operation display unit HST which manages simulation executed by the simulation execution unit SM. The simulation execution unit SM and the operation display unit HST are connected to each other through a LAN.

The simulation execution unit SM and the operation display unit HST are implemented by two personal computers PC on which software for simulation is run under the management of a predetermined operating system (hereinafter, referred to as "OS").

Figure 5:
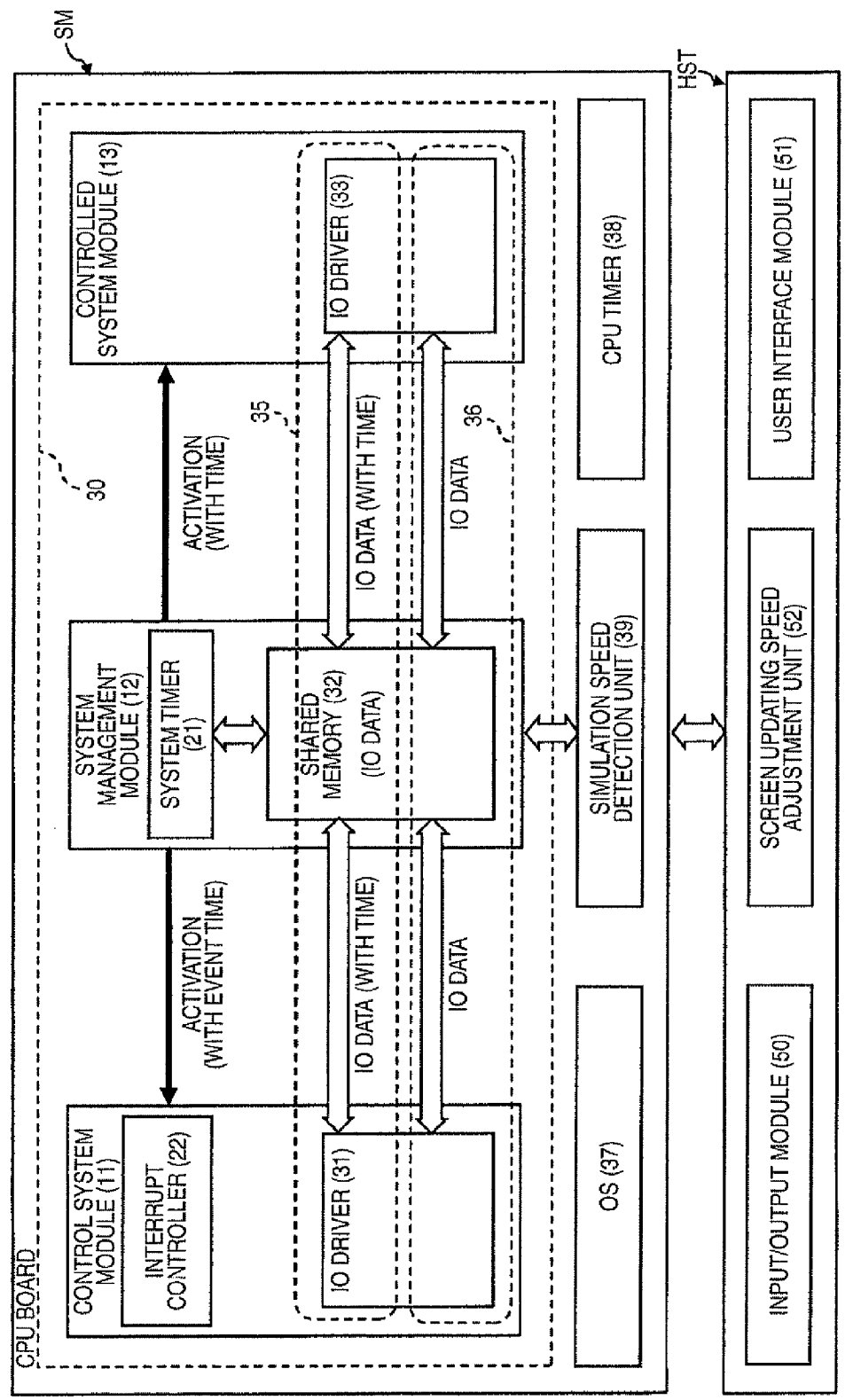
FIG. 5 is a block diagram illustrating the simulation system using the event driven SILS system.

As shown in FIG. 5, the simulation execution unit SM is an event driven SILS system and includes a control system module 11 which runs control software of a vehicle serving as an evaluation object, a controlled system module 13 which simulates the vehicle to be controlled by control software, and a system management module 12 which manages events, which are generated in the control system module 11 or the controlled system module 13, and drives the control system module 11 or the controlled system module 13 based on the events which are generated in time series.

The modules 11, 12, and 13 are implemented by software for simulation and control software which are stored in a memory on a CPU board 30 of a personal computer PC, which operates on a predetermined OS 37, a CPU timer 38, and a high-performance CPU which runs software in accordance with the CPU timer 38.

The system management module 12 includes a shared memory 32 for exchanging input/output data (IO data) between the control system module 11 and the controlled system module 13, and a system timer 21 which sets and manages the activation time of events to be generated in synchronization with the control system module 11 or the controlled system module 13. A block of the control system module 11 or the controlled system module 13 corresponding to each event is activated based on the value of the system timer 21.

As shown in FIG. 6, the control system module 11 includes control software 2, an interrupt controller 22 which runs a necessary block of control software 2, and an JO data unit 23 which performs data input/output with respect to control software 2.

The control system module 11 also includes a capture function unit 24, a compare function unit 25, a communication function unit 26, a port function unit 27, and the like, which executes predetermined sequence control between the interrupt controller 22 or the IO data unit 23 and external input/output data 28 and 29.

External input/output data 28 and 29 includes data which is written as the simulation result to the shared memory 32 from the controlled system module 13, or data which is written as the result of the arithmetic process to the shared memory 32 from the control system module 11.

Pulse input data 28-1 includes the engine revolution, a speed sensor signal, and the like. The capture function unit 24 to which pulse input data 28-1 is input captures the time of an effective edge of a specified pulse based on timer information of the system timer 21 which is free-running, and writes the captured time to the IO data unit 23.

At this time, an interrupt can be generated by the interrupt controller 22. When the interrupt is generated, an interrupt routine of control software 2 is activated through the interrupt controller 22.

Pulse output data 28-2 includes an ignition signal, a fuel injection signal, and the like. When a predetermined pulse needs to be sent as pulse output data 28-2 when 1 msec elapses from the current time, the compare function unit 25 determines whether or not the current time is identical to the time after 1 msec, and if so, outputs the predetermined pulse. At this time, an interrupt can be generated by the interrupt controller 22. The ignition timing or fuel injection timing is calculated and updated by control software 2 based on the latest engine revolution.

The communication function unit 26 performs communication with an external intelligent IC through serial communication data 29-1, and if needed, generates an interrupt. The port function unit 27 reads data when IO port data 29-2 is input data, and outputs data when IO port data 29-2 is output data. IO port data 29-2 includes, for example, an IG switch, a starter switch, a magnet clutch of an air conditioner, and the like.

As shown in FIG. 5, the exchange of input/output information between the control system module 11 and the controlled system module 13 is performed via the system management module 12. Input/output information between the control system module 11 and the system management module 12 includes "activation (with event time)", "IO data (with time)", and "IO data". Input/output information between the system management module 12 and the controlled system module 13 includes "activation (with time)", "IO data (with time)", and "IO data".

The system timer 21 defines the reference time of the simulation execution unit SM, and predetermined blocks of the control system module 11 and the controlled system module 13 which are activated by the system management module 12 operates based on the system timer 21. That is, the control system module 11 and the controlled system module 13 operate for the same virtual time based on the system timer 21.

The control system module 11 and the controlled system module 13 are respectively provided with a control system module-side IO driver 31 and a controlled system module-side IO driver 33 which writes or reads IO data with time about the respective events to or from the shared memory 32.

Timing-dependent IO data written from the IO drivers 31 and 33 to the shared memory 32 is managed in synchronization with the time of the system timer 21 (in the drawings, a dotted frame 35), and timing-independent IO data is managed without being associated with the time of the system timer 21 (in the drawings, a dotted frame 36).

That is, if event requests are detected, the system management module 12 integrates the event requests based on IO data written to the shared memory 32 from the control system module 11 or the controlled system module 13, sets the time updated by the system timer 21 for the respective events, and accumulates the time in the shared memory 32.

For example, pulse input data 28-1 or pulse output data 28-2 is managed as timing-dependent IO data, and serial communication data 29-1 or IO port data 29-2 is managed as timing-independent IO data.

IO data which is written to the shared memory 32 through the IO driver of the control system module 11 or the controlled system module 13 includes data about the events which are managed by the system management module 12, and also stores IO data which is necessary for control or simulation between the control system module 11 and the controlled system module, 13, and IO data which is necessary for signal monitoring described below.

That is, a control system including the ECU which controls the vehicle and an in-vehicle device, such as an engine or the like, which is controlled by the ECU is simulated by the simulation execution unit SM. Note that the control system which is simulated by the simulation execution unit SM is not limited to the engine system, and it may be an arbitrary functional block of the vehicle, such as a brake system, a transmission system, or the like.

Hereinafter, an example of the operation of the simulation execution unit SM will be described with reference to a timing chart of FIG. 7.

The columns (a), (b), (c), and (d) of FIG. 7 respectively represent the operations of the system management module 12, the control system module 11, the controlled system module 13, and the system timer 21. The horizontal axis is a time axis and is marked with time t0, t1, . . . , and t5 to correspond to the respective events. The contents of the respective events are shown in FIG. 8.

The system management module 12 first generates a 1 msec-interval interrupt therein, and stores the interrupt event in the shared memory 32 at the time t0 of the system timer 21. In the control system module 11 and the controlled system module 13 which detect the interrupt event, a corresponding punctual process block is activated. Thereafter, in the system management module 12, another event to be subsequently generated and the 1 msec-interval interrupt event are scheduled in time series.

Specifically, in response to the above-described interrupt event, a 1 msec-interval interrupt process block is activated in the control system module 11, and a main process is activated in the controlled system module 13.

If the control system module 11 outputs any signal (or example, an IO pulse) to the shared memory 32 through the IO driver 31 at the timing a1 of FIG. 7 while the 1 msec-interval interrupt process block is being activated, the system management module 12 adds an event corresponding to the relevant signal to scheduling data written to the shared memory 32. In the main process by the controlled system module 13, if any signal is output to the shared memory 32 through the IO driver 33 at the timing a2 of FIG. 7, the system management module 12 adds an event corresponding to the relevant signal to scheduling signal written to the shared memory 32.

In the main process by the controlled system module 13 at the time t0, if the system management module 12 receives a "pulse 1 output" request from the controlled system module 13, a corresponding pulse generation time is set, and for example, a "pulse 1 output" event at the time t1 is generated. In the control system module 11, a "pulse 1 output" block is activated at the timing b1 of FIG. 7 in response to the "pulse 1 output" event. Here, the control system module 11 executes an arithmetic process based on the timer value of the system timer 21.

If the system management module 12 receives a "pulse 2 output" request with a pulse output process by the control system module 11 at the time t1, a corresponding pulse generation time is set with the updated timer value (the timing a3 of FIG. 7) of the system timer 21 as a parameter. At the time t2, a "pulse 2 output" process by the control system module 11 is activated.

Meanwhile, if the system management module 12 receives a "pulse 3 output" request from the controlled system module 13, a corresponding pulse generation time is set. Here, at the time t3, a "pulse 3 input" event is generated, and a "pulse 3 input" process by the control system module 11 is activated.

Next, if the system management module 12 receives a "pulse 4 output" request from the control system module 11, a corresponding pulse generation time is set. Here, at the time t4, a "pulse 4 output" process by the control system module 11 is activated.

At the time t5, if a "reception event" is generated in the system management module 12 in accordance with the communication specification, the control system module 11 activates a corresponding "reception" process in response to the "reception event".

In this way, the events are accumulated in the shared memory 32, the relevant block of the control system module II or the controlled system module 13 is activated in time series based on the accumulated events, so simulation progresses.

The time of a process in the control system module 11 or the controlled system module 13 is defined as zero by the system timer 21. At the time t0, the time T is zero, and events are executed sequentially in time series while a process is skipped in a section where no event is generated. The time progresses in a stepwise manner due to the set time for each event. In the control system module 11 or the controlled system module 13 where a block corresponding to each event is activated, the actual process time of the event is measured by the CPU timer 38.

Figure 9:
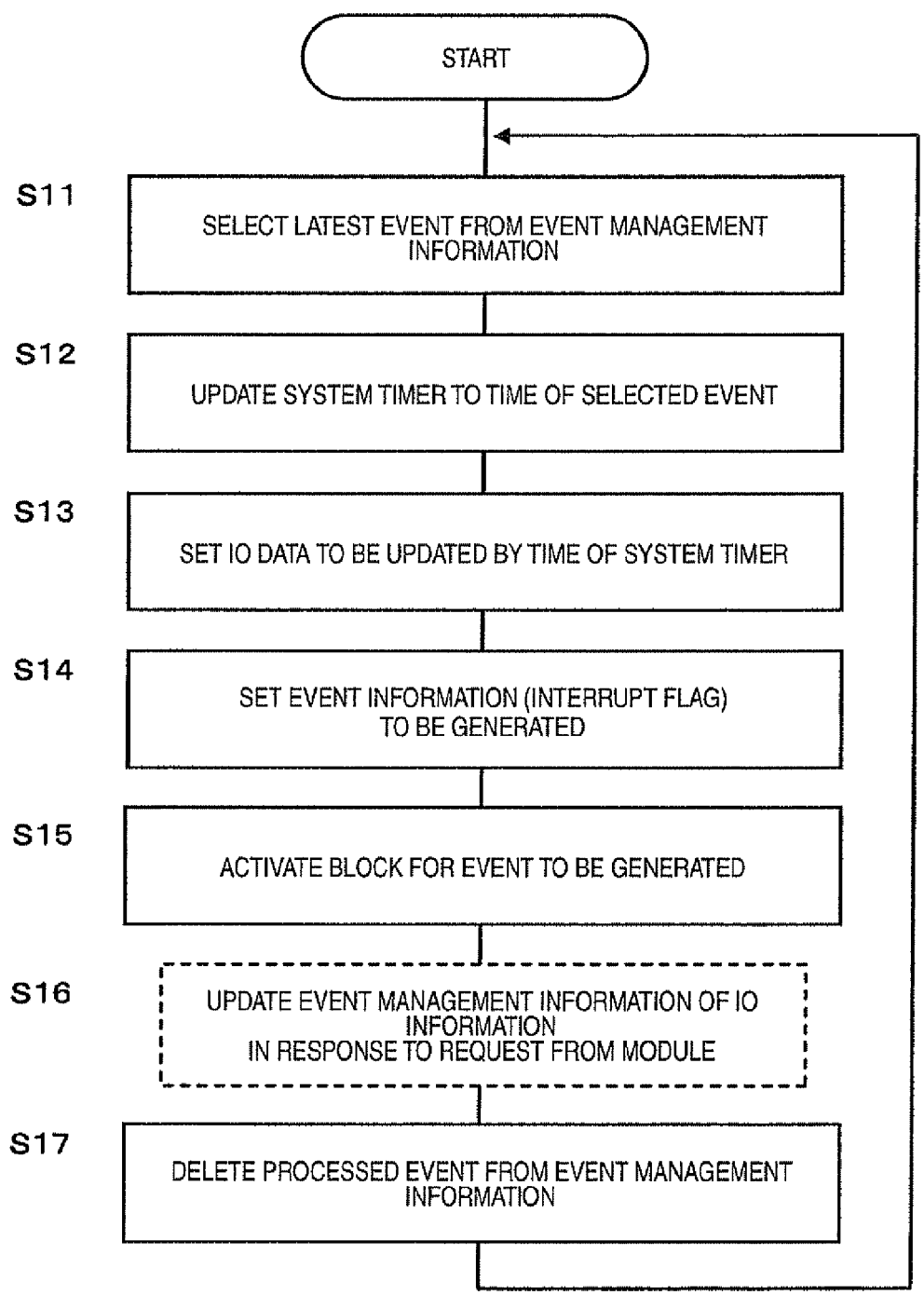
FIG. 9 is a flowchart illustrating the operation of a system management module.

As shown in FIG. 9, the system management module 12 selects a latest event from the event management information (S11), updates the value of the system timer to the time of the selected event (S12), sets IO data to be updated by the time of the system timer (S13), and sets event information (interrupt flag or the like to be generated (S14), so a corresponding block of the control system module 11 or the controlled system module 13 is activated (S15).

The block of the control system module 11 or the controlled system module 13 executes a predetermined integration process so as to request the system management module 12 to update IO information and event management information (S16). Thereafter, the processed event is deleted from the event management information (S17).

The operation display unit HST outputs the simulation conditions to the simulation execution unit SM, and receives the simulation result from the simulation execution unit SM so as to evaluate the control program which is run on the control system module 11.

In detail, as shown in FIGS. 4 and 5, the operation display unit HST includes an input/output module 50 which operates in synchronization with the simulation execution unit SM, delivers the simulation conditions to the simulation execution unit SM, and receives the simulation result from the simulation execution unit SM, and a graphical user interface module 51 which generates an operation screen for inputting the simulation conditions or an output screen representing the simulation result, and GUI-displays the generated screen on a liquid crystal display serving as a display unit.

When the simulation system is activated, the graphical user interface module 51 generates an environment setting screen on which the operator sets the environmental conditions of simulation to be executed by the simulation execution unit SM and displays the environment setting screen on the display unit. Then, if the environmental conditions are set through the configuration screen, the user interface module 51 generates an operation screen for activating or stopping simulation and setting the simulation conditions, or an output screen representing the simulation result by the simulation execution unit SM, and displays the generated screen on the display unit.

On the environment setting screen, the environmental conditions of the simulation execution unit SM are set. For example, the environmental conditions, such as selection of events to be managed by the system management module 12, selection of IO data to be exchanged between the control system module 11 and the controlled system module 13 through the shared memory 32, definition of a memory map, and the like, are set.

The environmental conditions set on the environment setting screen are transmitted to the simulation execution unit SM through the input/output module 50, and distributed to the control system module 11 and the controlled system module 13 through the system management module 12, such that the initial conditions of the simulation execution unit SM are set.

As shown in FIG. 4, on the operation screen, operating switches necessary for operating the engine, such as a simulation activation/stop switch, an ignition switch, an accelerator pedal operating switch, a shift lever operating switch, and the like, and meters for monitoring the status of the engine, such as a speedometer, a tachometer, a heat indicator, a voltmeter, and the like, are graphic-displayed.

Operation information which is set by the operator on the operation screen is transmitted to the simulation execution unit SM through the input/output module 50. When this happens, a corresponding event is generated by the system management module 12 and processed by the control system module 11 or the controlled system module 13.

The simulation result by the simulation execution unit SM is transmitted to the input/output module 50 of the operation display unit HST through the system management module 12 and delivered to the user interface module 51.

As shown in FIG. 4, the user interface module 51 displays, on the display unit, the operation screen which includes a trend graph, in which IO data included in the simulation result is plotted in time series.

As described above, the operation display unit HST and the simulation execution unit SM are connected to each other by a LAN cable, so data packet communication is performed through communication interfaces respectively provided in the operation display unit HST and the simulation execution unit SM.

Environment information or the simulation conditions set by the operator on the operation display unit HST are transmitted to the simulation execution unit SM in synchronization with the operation. Then, an event executed by the simulation execution unit SM and IO data about the event are read from the shared memory 32 when the event is processed, and then transmitted to the operation display unit HST. That is, the operation display unit HST operates in synchronization with the simulation execution unit SM. Note that data which is transmitted and received through the communication interfaces is buffered by memories respectively provided in the operation display unit HST and the simulation execution unit SM such that data missing due to the communication timing does not occur.

The simulation system 1 according to the embodiment may be implemented by a single personal computer which runs software functioning as the simulation execution unit SM and the operation display unit HST. In this case, data is exchanged through a memory, which stores communication data, instead of the LAN.

Figure 10:
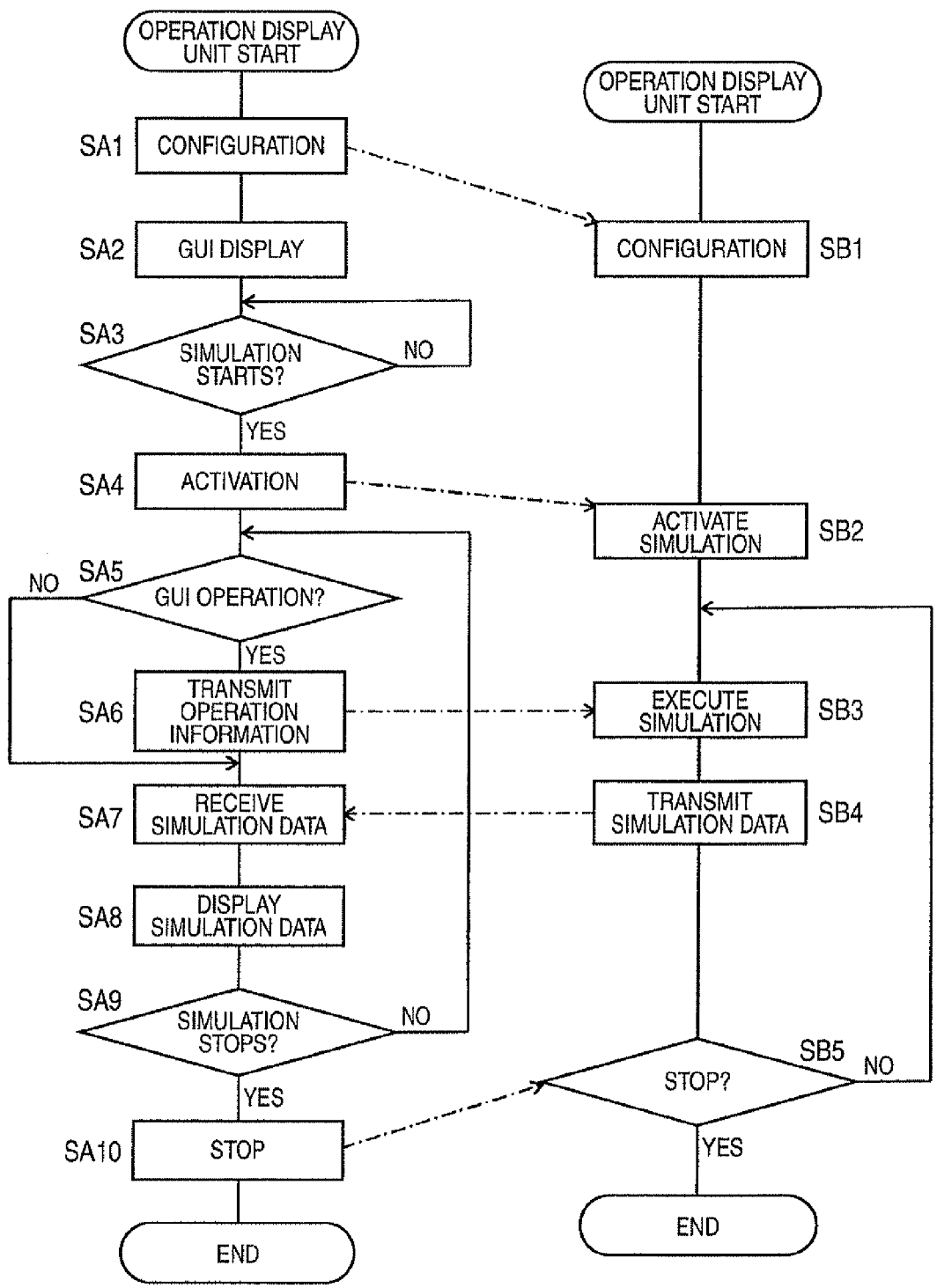
FIG. 10 is a flowchart illustrating the operation of a simulation system.

As shown in FIG. 10, if power is supplied and the simulation system is activated, in the operation display unit HST, the user interface module 51 displays the environment setting screen on the display unit, and the environmental conditions set by the operator are transmitted to the simulation execution unit SM through the input/output module 50 (SA1). In the simulation execution unit SM, an event or IO data necessary for simulation is set based on the transmitted environmental conditions (SB1).

Next, in the operation display unit HST, the user interface module 51 displays the operation screen on the display unit (SA2). Then, if the operator operates the simulation activation switch (SA3), an activation command is transmitted to the simulation execution unit SM through the input/output module 50 (SA4), and the simulation execution unit SM activates simulation (SB2).

Thereafter, if the operator operates the operation screen (SA5), corresponding operation information is transmitted to the simulation execution unit SM through the input/output module 50 (SA6), and the simulation execution unit SM progresses the simulation based on the relevant operation information (SB3).

For example, if the operator operates to turn on the ignition switch displayed on the operation screen, the simulation execution unit SM executes simulation in a state where the ignition switch is turned on. If the operator operates to turn on the starter switch displayed on the operation screen, the simulation execution unit SM executes simulation for starting the engine.

If the accelerator pedal operating switch displayed on the operation screen is operated after the engine has started, the simulation execution unit SM executes simulation such that the engine revolution is changed in accordance with the operation amount of the accelerator pedal.

If the respective events which are processed by the simulation execution unit SM are processed, the system management module 12 writes event information stored in the shared memory 32 at that time or associated IO data to a buffer for transmission, and transmits the event information or associated IO data as the simulation result to the operation display unit HST through the communication interface (SB4).

When receiving the simulation result, the input/output module 50 of the operation display unit HST activates the user interface module 51 (SA7). The user interface module 51 displays the operation screen and the output screen based on the simulation result (SA8).

For example, if the simulation execution unit SM executes simulation when the ignition switch is turned on in response to the turn-on operation of the ignition switch, the ignition switch being turned on is displayed on the operation screen. If the simulation execution unit SM executes simulation for changing the engine revolution in response to the operation of the accelerator pedal operating switch, graphic display of the speed meter or the tachometer on the operation screen is updated to correspond to the vehicle speed or the engine revolution, which is the simulation result, and the output screen representing the trend graph of the vehicle speed or the engine revolution is also updated.

The operation display unit HST repeats Steps SA5 to SA8 based on the operation by the operator. Then, if the operator operates the simulation stop switch (SA9), a simulation stop command is transmitted to the simulation execution unit SM (SA10), thus the simulation ends. The simulation execution unit SM repeats Steps SB3 and SB4 until the stop command is received, and if the stop command is received (SB5), ends the simulation.

As described above, the operator operates the control system through the operation screen displayed on the display unit, and visually confirms the output screen so as to evaluate the control program which is executed on the control system module 11.

Figure 1:
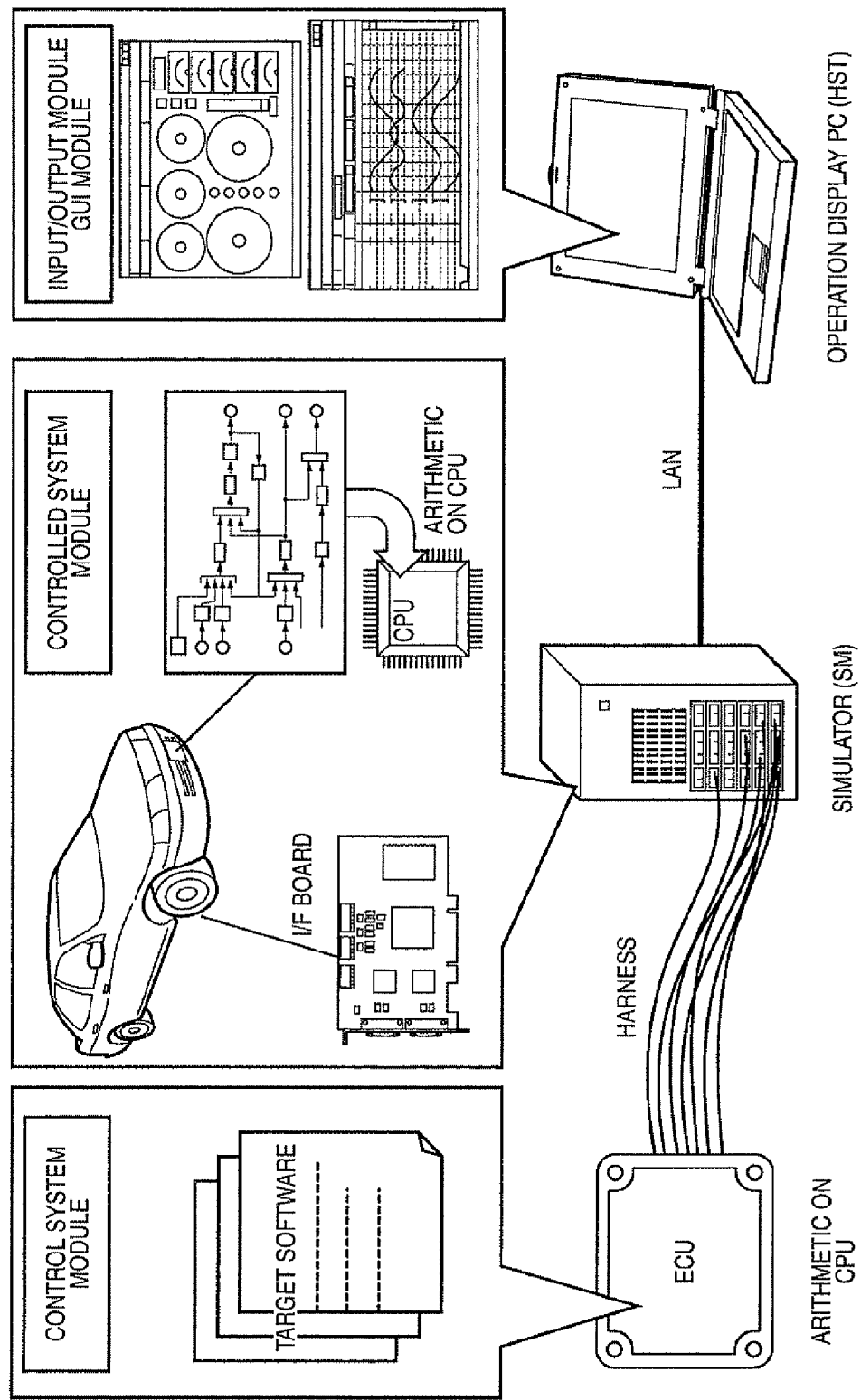
FIG. 1 is a schematic view illustrating a simulation system using a HILS system.
Figure 3A:
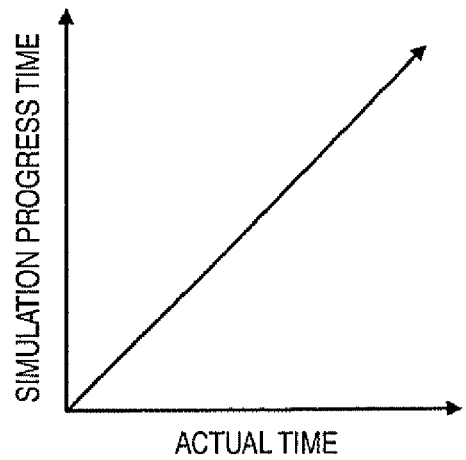
FIGS. 3A to 3C are explanatory diagrams illustrating the relationship between an actual time and a simulation progress time.
Figure 3B:
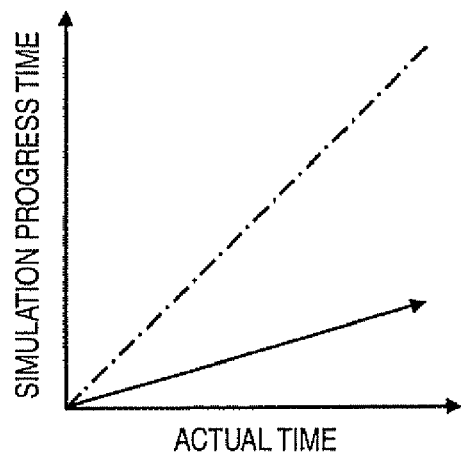
Figure 3C:
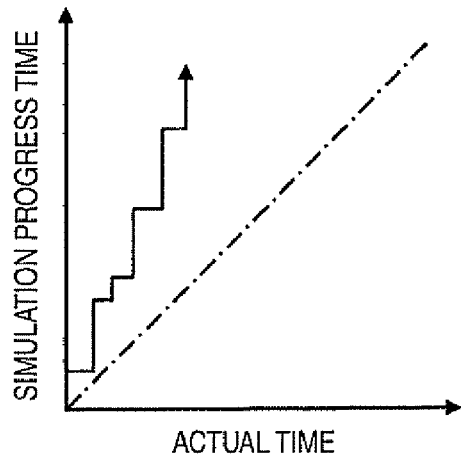

In the above-described SILS system, as shown in FIG. 3C, control software is executed in a stepwise manner in response to a predetermined event, and the simulation progress time is faster than the actual time and progresses in a stepwise manner. For this reason, the simulation progress time is unrelated to the actual time. For this reason, the operation screen that the operator will operate is instantaneously updated, so a necessary operation timing may not be ensured. Further, the output screen the operator will confirm is instantaneously updated, so the operator may miss a necessary confirmation timing.

Therefore, as shown in FIG. 5, the screen updating speed adjustment unit 52 is provided so as to adjust the updating speed of the operation screen or the output screen displayed on the display unit by the user interface module 51 to a value different from the processing speed of the simulation to be processed by the simulation execution unit SM.

A configuration is made such that a menu key for displaying a screen updating speed operation screen is displayed on the environment setting screen or the operation screen displayed on the display unit by the user interface module 51, and if the menu key is operated, the screen updating speed operation screen is displayed.

On the screen updating speed operation screen, options for setting the updating speed of the display screen are displayed such that the operation screen or the output screen can be updated and displayed at a processing speed lower than the processing speed of the simulation to be processed by the simulation execution unit SM.

For example, options are displayed such that the updating speed of the display screen can be set to one of 1/2, 1/10, 1/50, and 1/100 with the processing speed of the simulation as reference. Note that a configuration may be made such that the operator can directly input the updating speed as a numerical value.

If the operator selects any option, the screen updating speed adjustment unit 52 controls the user interface module 51 to update and display the display screen at the selected updating speed.

For example, a packet with a time stamp of the simulation result is transmitted from the simulation execution unit SM, or a time stamp is added to a packet received by the operation display unit HST. In this case, simulation speed detection unit is provided so as to grasp the processing speed of the simulation, such that the display screen is updated and displayed at a selected updated speed with respect to the relevant processing speed.

In this case, the updating speed of the display screen can dynamically be adjusted to correspond to the change in the processing speed of the simulation.

Options may be displayed on the screen updating speed operation screen so as to set the updating speed of the display screen without depending on the processing speed of the simulation. For example, a configuration may be made such that the screen update cycle of 100 msec, 200 msec, 500 msec, 1 sec, or the like can be selected.

With this configuration, the screen can be updated as if the simulation execution unit SM executes the simulation in real time. Of course, in this case, the simulation result transmitted from the simulation execution unit SM is held in the memory until the display update timing.

As shown in FIG. 5, a simulation speed detection unit 39 may be provided in the simulation execution unit SM so as to monitor the processing speed of the simulation. In this case, the screen updating speed adjustment unit 52 can adjust the updating speed of the operation screen or the output screen based on the processing speed detected by the simulation speed detection unit 39.

The simulation speed detection unit 39 monitors the values of the system timer 21, which is updated when each event is executed, so as to monitor the processing speed of the simulation. The processing speed for each event may be transmitted to the screen updating speed adjustment unit 52 through the LAN, or the average processing speed of a plurality of events may be transmitted to the screen updating speed adjustment unit 52 through the LAN.

The screen updating speed adjustment unit 52 may update the display screen at an updating speed, which is set in advance with the processing speed of the simulation as reference, or may update the display screen at an updating speed set by the screen updating speed operation screen, as described above.

The screen updating speed adjustment unit 52 may automatically adjust the updating speed of the operation screen or the output screen to any of a plurality of updating speeds, which are set in advance on the environment setting screen, based on the processing speed detected by the simulation speed detection unit 39. In this case, it should suffice that the processing speed of the simulation is divided into a plurality of ranges, high speed, medium speed, and low speed, and the updating speed is automatically changed in accordance with the ranges.

Instead of changing the updating speed in accordance with the processing speed of the simulation, the screen updating speed adjustment unit 52 may automatically change the updating speed based on the environment of the simulation system. For example, the updating speed may be automatically changed based on the hardware environment, such as the capacity of the memory, which stores the simulation result until the display update timing, the drawing performance of the display screen by the user interface module 51, or the like.

Although in the above description, the configuration has been described in which the screen updating speed adjustment unit 52 controls the user interface module 51 to update and display the display screen at the updating speed selected on the screen updating speed operation screen, a configuration may be made such that the screen updating speed adjustment unit 52 adjusts the processing speed of the simulation execution unit SM so as to adjust the updating speed of the operation screen or the output screen.

For example, the screen updating speed adjustment unit 52 may be provided in the system management module 12 so as to adjust the processing speed by adding an idle process to a process, which is executed by the simulation execution unit SM.

Figure 11:
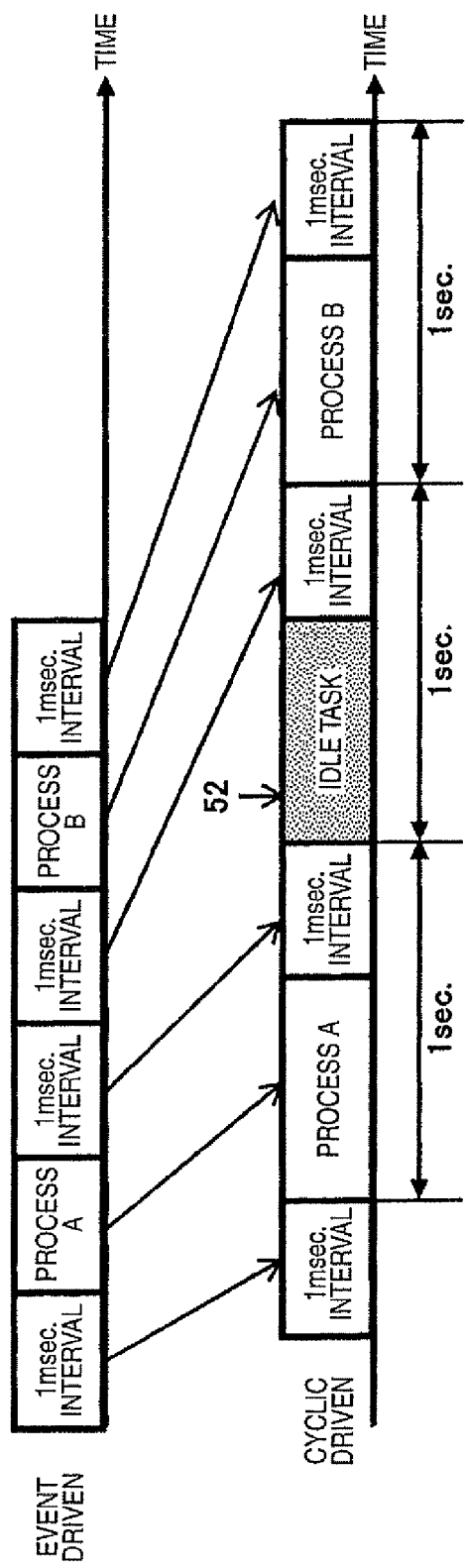
FIG. 11 is an explanatory view of adjustment of a simulation execution unit for screen updating speed adjustment.

In detail, as shown in FIG. 11, during an event where the system management module 12 drives the control system module 11 or the controlled system module 13, the screen updating speed adjustment unit 52 inserts an idle task, such that the control system module 11 or the controlled system module 13 is apparently driven in real time. It should suffice that the length of the idle task is set on the screen updating speed operation screen.

Although in the foregoing embodiment, a case has been described in which the adjustment timing of the updating speed of the operation screen or the output screen by the screen updating speed adjustment unit 52 is not particularly limited and is constantly adjusted, a configuration may be made such that the screen updating speed adjustment unit 52 adjusts the updating speed of the operation screen or the output screen only when a predetermined event set in advance, such as the output of the fuel injection pulse or the like, is generated.

That is, the screen updating speed adjustment unit 52 monitors the simulation result which is transmitted from the simulation execution unit SM, and when a predetermined event is included in the simulation result, adjusts the updating speed of the operation screen or the output screen. In this case, it should suffice that the updating speed is set based on the processing speed detected by the simulation speed detection unit 39 or an option on the screen updating speed operation screen.

Such a configuration is effective when detailed timing verification of IO data which is output from the control system module 11 or the controlled system module 13 is needed, not simple logic verification.

As described above, the simulation method according to the embodiment includes an input/output step which is executed by the input/output module 50 in synchronization with the simulation execution unit SM, which simulates the control system at a predetermined processing speed, and in which the simulation conditions is delivered to the simulation execution unit SM and the simulation result is received from the simulation execution unit SM, a user interface display step which is executed by the user interface module 51, and in which the operation screen for inputting the simulating conditions or the output screen representing the simulation result is generated and displayed on the display unit, a simulation execution step in which the simulation execution unit SM executes simulation based on the simulation conditioned delivered in the input/output step, and outputs the simulation result, and a screen updating speed adjustment step which is executed by the screen updating speed adjustment unit 52, and in which the updating speed of the operation screen or the output screen displayed on the display unit in the user interface display step is adjusted to a value different from the processing speed.

Hereinafter, another embodiment will be described. Although in the foregoing embodiment, an example where the simulation execution unit SM is formed by an event driven SILS system has been described, the invention may be applied to a case where the simulation execution unit SM is formed by a cyclic driven SILS system.

Figure 12:
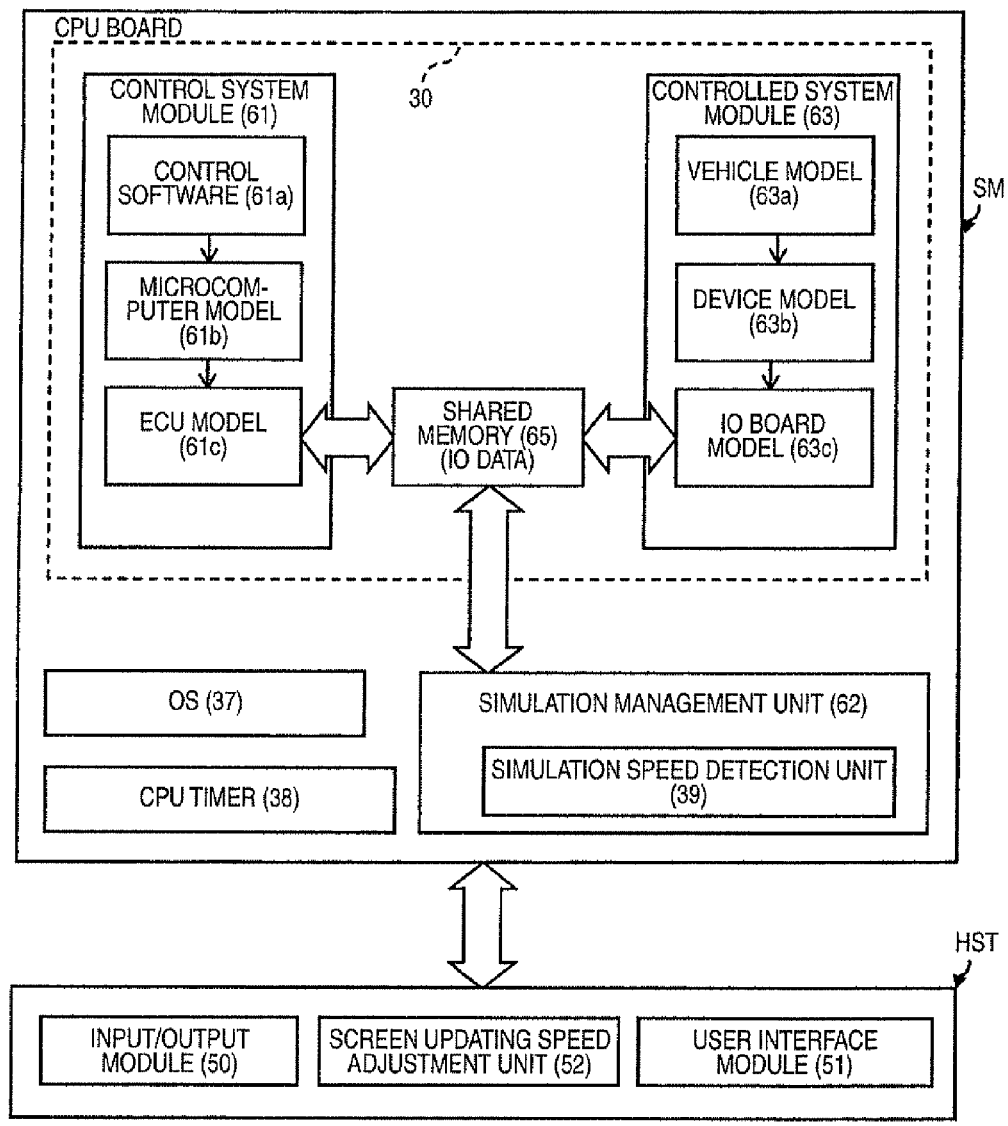
FIG. 12 is a block diagram illustrating a simulation system using a cyclic driven SILS system.

As shown in FIG. 12, a cyclic driven SILS system includes a control system module 61 which runs control software of the vehicle, and a controlled system module 63 which simulates the vehicle to be controlled by control software. In this system, the simulation of the vehicle control system is executed at a predetermined processing speed in synchronization with input/output data generated by the control system module or the controlled system module.

The control system module 61 includes a control software 61*a*, a microcomputer model 61*b* which simulates a microcomputer running control software 61*a*, and an ECU model 61*c* which simulates a peripheral circuit of the microcomputer. The controlled system module 63 includes a vehicle model 63*a* which simulates the vehicle, a device module 63*b* which simulates a device for converting output data from the vehicle model 63*a* into an analog electrical signal, and an IO board model 63*c* which simulates an IO board, which relays the devices and the ECU. IO data is exchanged between the ECU model 61*c* and the IO board model 63*c* through a shared memory 65.

In the microcomputer model 61*b* or the ECU model 61*c*, the motion of the microcomputer or the like is simulated in detail, so even though a high-performance CPU is used, a load imposed on the control system module 61 is considerably increased.

For this reason, as shown in FIG. 3B, if a cyclic driven SILS system is used, the execution cycle of control software is long, and the simulation progress time becomes longer than the actual time. For this reason, even though the operator operates the operation screen, it may be impossible to determine whether the operation is received or not since a display response is delayed, and the operator may erroneously operate the operation screen again.

Therefore, similarly to the above-described event driven SILS system, a screen updating speed adjustment unit 52 is provided so as to adjust the updating speed of the operation screen or the output screen displayed on the display unit by the user interface module 51 to a value different from the processing speed of the simulation which is processed by the simulation execution unit SM.

In the cyclic driven SILS system, a simulation management unit 62 is provided so as to exchange data with the operation display unit HST. The simulation management unit 62 sets IO data, which is exchanged between the control system module 61 and the controlled system module 63, based on the environmental conditions transmitted from the operation display unit HST, monitors IO data through the shared memory 65 during the simulation, and transmits IO data to the operation display unit HST.

A simulation speed detection unit 39 is provided in the simulation management unit 62 so as to detect the processing speed of the simulation execution unit SM. The operations of the screen updating speed adjustment unit 52 and the simulation speed detection unit 39 are the same as that in the event driven SILS system.

In the cyclic driven SILS system, a menu key for displaying a screen updating speed operation screen is displayed on the environment setting screen or the operation screen displayed on the display unit by the user interface module 51. If the operator operates the menu key, the screen updating speed operation screen is displayed.

On the screen updating speed operation screen, options for setting the updating speed of the display screen are displayed such that the operation screen or the output screen can be updated and displayed at a processing speed faster than the processing speed of the simulation which is processed by the simulation execution unit SM.

For example, options are displayed such that the updating speed of the display screen can be set to any of 2 times, 10 times, 50 times, and 100 times faster than the processing speed of the simulation. Note that in this case, a configuration may be made such that the operator directly inputs the updating speed as a numerical value.

If the operator selects an option, the screen updating speed adjustment unit 52 controls the user interface module 51 to update and display the display screen at the selected updating speed.

In the cyclic driven SILS system, the screen updating speed adjustment unit 52 adjusts the updating speed of the display screen to be higher than the processing speed of the simulation execution unit SM. However, when there is no change in IO data, which is the simulation result transmitted from the simulation execution unit SM, within the update cycle of the output screen, even if the updating speed of the output screen increases, no change appears.

For this reason, in a trend graph which is displayed as the output screen user by the interface module 51, the same data value is plotted along the time axis, but it can at least be understood from the change of the screen that the simulation is in progress.

Meanwhile, even though the ignition switch or the accelerator pedal operating switch displayed on the operation screen is operated, unless a corresponding process is performed by the simulation execution unit SM, it may be impossible to recognize that the operator has completed the operation.

Therefore, if operation information on the operation screen is received by the simulation management unit 62, reception information for the operation information is returned to the input/output module 50 by the simulation management unit 62 until a corresponding process is performed by the simulation execution unit SM. Further, when the operation screen is updated and displayed by the user interface module 51 which is activated by the input/output module 50, display purporting that a corresponding switch is operated is added.

For example, the display color of the corresponding switch differs, or a message purporting that the operation of the corresponding switch is confirmed is displayed on the operation screen.

The screen updating speed adjustment unit 52 may adjust the processing speed of the simulation execution unit SM so as to adjust the updating speed of the operation screen or the output screen.

For example, the screen updating speed adjustment unit 52 may be provided in the simulation management unit 62 so as to adjust the processing speed by deleting an idle process which is added to a process to be executed by the simulation execution unit SM.

Although a case where the simulation execution unit SM is formed by the SILS system has been described, the invention may also be applied to the HILS system. The HILS system is basically driven in real time, but for logic verification or the like, the operation performance of the operation display unit HST can be improved by adjusting the updating speed of the operation screen or the output screen.

The foregoing embodiments are merely an embodiment for implementing the invention. The specific configuration of each section or unit may be appropriately changed in accordance with a system to be constructed insofar as it can provide the same advantages as the invention.

What is claimed is:

1. A simulation system comprising:
   a simulator configured to execute simulation of a simulation object at a processing speed;
   a user interface module configured to generate at least one of a first operation screen for inputting simulation conditions on the simulation executed by the simulator and an output screen for representing a result of the simulation executed by the simulator, and to display the at least one of the first operation screen and the output screen on a display unit; and an adjustor configured to adjust an updating speed of the at least one of the first operation screen and the output screen on the display unit to be different from the processing speed independently from the processing speed.

2. The simulation system as set forth in claim 1, wherein the simulator executes the simulation asynchronously with an actual time.

3. The simulation system as set forth in claim 1, further comprising a detector configured to monitor the processing speed of the simulation executed by the simulator, wherein the adjustor adjusts the updating speed of the at least one of the first operation screen and the output screen based on the processing speed monitored by the detector.

4. The simulation system as set forth in claim 3, wherein the adjustor adjusts the updating speed of the at least one of the first operation screen and the output screen to one of a plurality of updating speeds set in advance based on the processing speed monitored by the detector.

5. The simulation system as set forth in claim 1,
wherein the user interface module is configured to display a second operation screen for setting the updating speed on the display unit,
wherein the adjustor updates the at least one of the first operation screen and the output screen at the updating speed set through the second operation screen.

6. The simulation system as set forth in claim 1,
wherein the simulator includes a control system module configured to run control software of a vehicle and a controlled system module configured to simulate the vehicle to be controlled by the control software, and wherein the simulator executes the simulation at the processing speed in synchronization with input-output data which is generated in at least one of the control system module and the controlled system module.

7. The simulation system as set forth in claim 1,
wherein the simulator includes:
a control system module configured to run control software of a vehicle;
a controlled system module configured to simulate the vehicle to be controlled by the control software; and
a system management module configured to manage events which are generated in at least one of the control system module or the controlled system module, and to control the at least one of the control system module and the controlled system module based on the events which are generated in time series, and wherein the simulator executes the simulation in terms of the events managed by the system management module.

8. The simulation system as set forth in claim 7, wherein the adjustor adjusts the updating speed of the at least one of the first operation screen and the output screen when an event predetermined in advance is generated.

9. A simulation method executed in a simulation system including at least a simulator and a user interface module with a display unit, comprising:
displaying a first operation screen on the display;
inputting simulation conditions through the first operation screen;
executing simulation by the simulator at a processing speed, based on the simulation conditions;
displaying an output screen which represents a result of the simulation on the display; and
adjusting an updating speed of the at least one of the first operation screen and the output screen to be different from the processing speed independently from the processing speed.

* * * * *